United States Patent [19]

Ameen et al.

[11] Patent Number: 5,228,965
[45] Date of Patent: Jul. 20, 1993

[54] METHOD AND APPARATUS FOR APPLYING SURFACE TREATMENT TO METAL FOIL

[75] Inventors: Thomas J. Ameen, Mentor; Adam G. Bay, Chesterland; Robert D. DeWitt, Lyndhurst, all of Ohio

[73] Assignee: Gould Inc., Eastlake, Ohio

[21] Appl. No.: 606,051

[22] Filed: Oct. 30, 1990

[51] Int. Cl.$^5$ .......................................... C25D 17/00
[52] U.S. Cl. .................................................. 204/206
[58] Field of Search ........................................ 204/206

[56] References Cited

U.S. PATENT DOCUMENTS

| | | | |
|---|---|---|---|
| 740,359 | 9/1908 | Fletcher | 204/13 |
| 2,271,735 | 2/1942 | Hall | 204/206 |
| 2,342,688 | 2/1944 | Paynter | 204/159 |
| 2,618,593 | 7/1949 | Rossel | 204/199 |
| 3,151,048 | 9/1964 | Conley et al. | 204/13 |
| 3,443,996 | 5/1969 | Falk et al. | 204/206 |
| 3,445,371 | 5/1969 | Johnston | 204/206 |
| 3,461,064 | 8/1969 | Clancy | 204/13 |
| 3,483,098 | 12/1969 | Kramer | 204/28 |
| 3,483,113 | 12/1969 | Carter | 204/206 |
| 3,634,223 | 1/1972 | Carter | 204/206 |
| 3,767,537 | 10/1973 | Selker | 204/13 |
| 3,901,785 | 8/1975 | Buzhinskaya et al. | 204/208 |
| 4,318,794 | 3/1982 | Adler | 204/216 |
| 4,692,221 | 9/1987 | Parthasarathi | 204/13 |
| 4,702,812 | 10/1987 | Economopoulos | 204/208 |
| 4,778,571 | 10/1988 | Nakatsugawa | 204/13 |
| 4,898,647 | 2/1990 | Luce et al. | 204/13 |

FOREIGN PATENT DOCUMENTS 2324834 9/1974 Fed. Rep. of Germany .
1543301 4/1979 United Kingdom .

Primary Examiner—T. M. Tufariello
Attorney, Agent, or Firm—D. Peter Hochberg; Mark Kusner

[57] ABSTRACT

An apparatus for applying a surface treatment to a metal foil comprising a drum rotatable about a generally horizontal axis for guiding a continuous metal foil about a predetermined path; anode means adapted to contain electrolyte solution, the anode means having a smooth, generally upward facing anode surface defining a cylindrical cavity, which cavity is dimensioned to surround a portion of the drum and to define an annular gap between the smooth surface and the drum, a predetermined portion of the predetermined path of the metal foil extending through the gap; inlet means for creating a continuous flow of electrolyte through the gap; and power means connected to the foil and the anode to create an electrical potential across the foil and smooth surface of the anode means.

16 Claims, 3 Drawing Sheets

METHOD AND APPARATUS FOR APPLYING SURFACE TREATMENT TO METAL FOIL

FIELD OF THE INVENTION

The present invention relates to electroplating, and more particularly to an anode in an electroplating apparatus. The present invention is particularly applicable for treating copper foil and will be described with particular reference thereto, although the present invention finds advantageous application in surface treatment of other metal foils.

BACKGROUND OF THE INVENTION

The present invention is applicable to the treatment of electrodeposited copper foil. Much of the copper foil formed by the electrodeposition process is used in the printed circuit board industry. When used for printed circuit boards, the electrodeposited copper foil is bonded to a dielectric substrate. It is generally known that bare electrodeposited copper foil exhibits poor adhesion properties because of its relatively smooth surfaces. To improve the adhesion properties, it is known surface treat the copper foil. Such surface treatment may comprise adding a layer of dendritic copper or copper oxide particles to the base copper foil. Other metals, such as brass or chromium, may also be added to the foil to enhance the physical properties thereof.

Treatment of an existing foil typically does not require the high power levels necessary in electroforming foil, and therefore, treatment line speeds are generally three to four times the speed of an electroforming apparatus. In this respect, the speed and efficiency of a foil treating line is limited not so much by power requirements, but by the ability to control certain other operating parameters.

One such parameters is the interelectrode gap formed between the anode and the surface to be treated. While the interelectrode gap in a treatment apparatus is not as critical as the interelectrode gap in a foil forming apparatus (in that less power is required to treat an existing foil as compared to forming a new foil), a uniform interelectrode gap enables precise current density control along the path of the foil which, in conjunction with control of other parameters, produces more uniform surface treatment.

Other important parameters are the flow of the electrolytic fluid between the anode and the surface to be treated and the chemical composition of such fluid. In this respect, it is important to maintain a proper concentrations of plating ions in the vicinity of the foil to be paled (i.e. treated) and to replace ions which have been deposited onto the foil. Thus, the ability to control the electrolyte solution, i.e. its concentration and flow rate, also affects the efficiency of the treatment line.

Another parameter, which is generally related to both the electrolytic solution and the efficiency of the treating line is the temperature of the electrolytic solution. As is well known in the art, an electrode treating process creates considerable heat in the interelectrode gap, and such heat can cause current density fluctuations within the interelectrode gap. Forcing the electrolytic fluid through the interelectrode gap is one way of removing heat and generated gas therefrom. In this respect, by controlling the flow of electrolytic fluid through the gap, heat in the interelectrode gap can be reduced and the current density fluctuations can be minimized.

Heretofore, it has been known to provide an electrolytic cell by immersing a cathode surface in a large tank of electrolytic solution and by immersing an anode in the tank adjacent to the cathode surface. The large volume of electrolytic solution in such a tank provides a convenient heat sink to dissipate heat, and permits recirculation of the electrolytic fluid through a heat exchanger to maintain a selected temperature. A mixer may also be provided to maintain a selected chemical concentration in the electrolytic solution.

As will be appreciated, such arrangements generally require large amounts of electrolytic solution, but more importantly, generally, do not provide an accurate means of monitoring the actual solution concentration in the interelectrode gap or flow rate through the gap. Moreover, current density in the interelectrode gap may be affected by the electrolytic solution surrounding the anode and the concentration thereof.

The present invention relates to an apparatus for applying a surface treatment to metal foil, which apparatus provides greater control over the parameters which affect the efficient treatment of quality foil. The present invention allows greater control over the aforementioned treatment parameters by providing an anode which defines an interelectrode gap and at the same time generally functions as a tank to confine the electrolytic solution to such gap. According to the present invention, only the anode surface facing the foil to be treated is exposed to electrolytic fluid wherein an electrical potential exists only between the foil to be treated and the anode. By confining the electrolytic solution in a predetermined space of known dimension, the flow, temperature, and concentration of the electrolytic fluid can be monitored and controlled to optimize the treatment parameters and thus provide greater control over the current density in the interelectrode gap.

SUMMARY OF THE INVENTION

In accordance with the present invention, there is provided an anode for use in an electrodeposition cell for treating a metal foil, which foil is movable through the cell across a rotatable drum. The anode is generally comprised of curved plate means having a lower surface facing away from the drum and a smooth cylindrical upper surface which is dimensioned to be positioned circumjacent the drum wherein an annular gap is defined between the drum and the cylindrical upper surface. The plate means is operable to contain an electrolytic solution within the gap and is formed from an electrically conductive material with the upper cylindrical surface being inert to said electrolytic solution. The annular gap defined between the drum and the anode includes a leading end and a trailing end defined by the direction of movement of the metal foil. Aperture means are formed in the plate means between the leading end and the trailing end of the gap to connect the gap with a source of electrolytic fluid, which fluid preferably continually flows into the gap. Collector means are mounted to the plate means at the leading end and trailing end of the gap to collect electrolytic solution flowing from the gap. Spaced-apart connector means are provided on the lower surface of the plate means to connect the plate means to an electrical power source.

In accordance with another aspect of the present invention, there is provided an apparatus for applying a surface treatment to a metal foil. The apparatus is comprised of a drum, which is rotatable about a generally horizontal axis for guiding a continuous metal foil about a predetermined path. Anode means adapted to contain an electrolytic fluid are provided adjacent to the drum. The anode means includes a smooth, generally upward facing anode surface, which is generally cylindrical in shape and dimensioned to surround the portion of the drum wherein an annular gap is defined between the smooth surface of the anode means and the drum. A portion of the predetermined path of the metal foil extends through the gap. Means for creating a continuous flow of electrolytic fluid through the gap is provided together with power means connected to the metal foil and the anode means to create an electrical potential across the foil and the smooth surface of the anode means.

It is an object of the present invention to provide an apparatus for electrodepositing surface treatment to metal foil.

Another object of the present invention is to provide an apparatus as defined above capable of higher treatment line speeds due to improved efficiency.

Another object of the present invention is to provide an apparatus as described above having a precise interelectrode gap.

Another object of the present invention is to provide an apparatus as described above which facilitates removal of gases formed during the electrotreating process.

A further object of the present invention is to provide an apparatus as defined above which facilitates precise flow control of the electrolytic fluid through the interelectrode gap.

A further object of the present invention is to provide an apparatus as defined above which utilizes less electrolytic solution.

A still further object of the present invention is to provide an apparatus as defined above wherein only the anodic surface facing the surface to be treated is exposed to electrolytic solution.

A still further object of the present invention is to provide an apparatus as described above wherein the anode functions essentially as a tank circumjacent the surface to be plated.

A still further object of the present invention is to provide an apparatus as described above providing increased anode surface exposed to the foil to be treated.

These and other objects and advantages will become apparent from the following description of preferred embodiments taken together with the accompanying drawings.

BRIEF DESCRIPTION OF THE DRAWINGS

The arrangement may taken physical form in certain parts and arrangement of parts, a preferred embodiment of which will be described in detail in the specification and illustrated in the accompanying drawings which form a part hereof and wherein.

DETAILED DESCRIPTION OF THE PREFERRED EMBODIMENT

Figure 1:
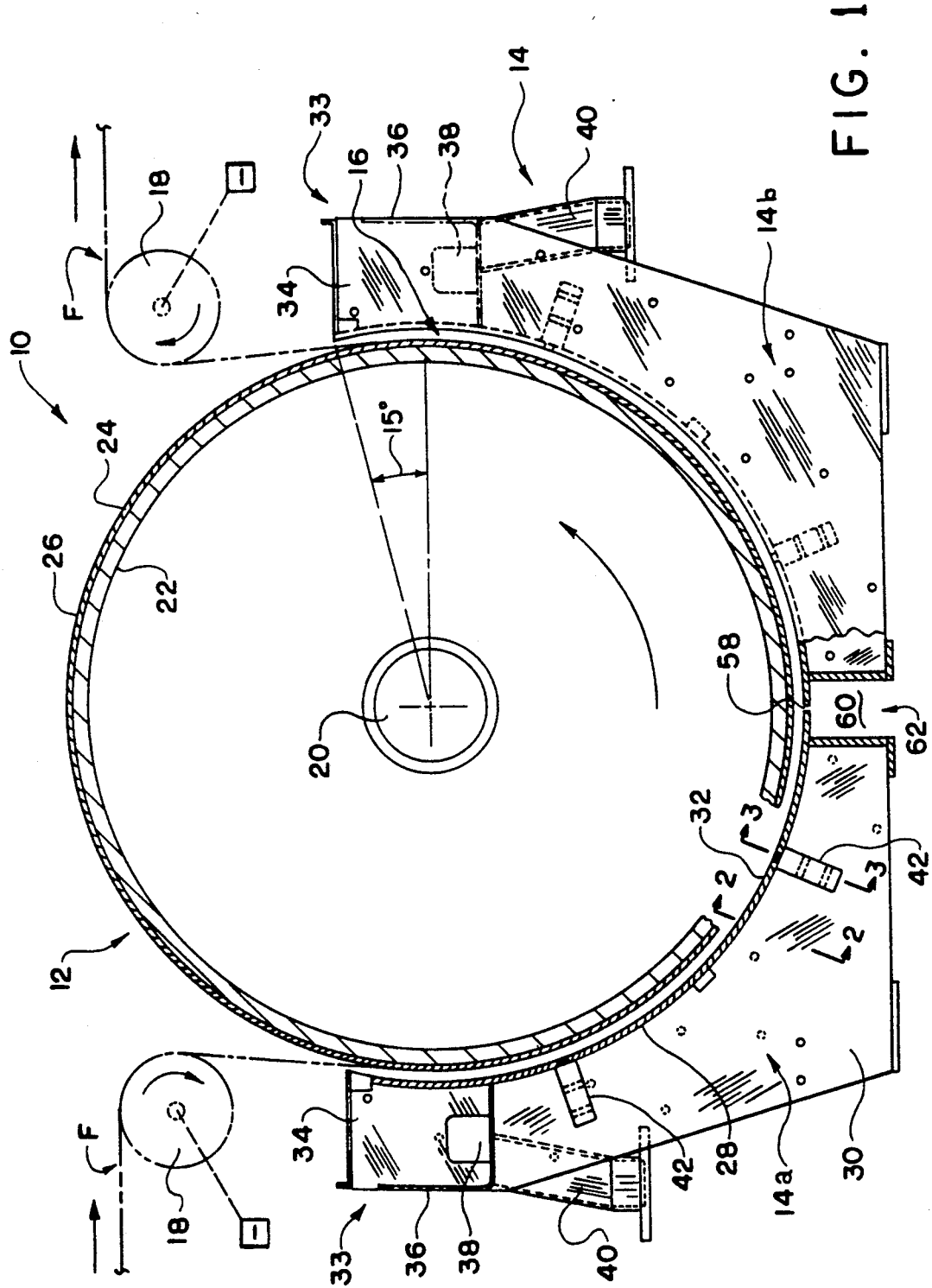
FIG. 1 is an end sectional view of a treatment cell for applying a surface treatment to a metal foil illustrating a preferred embodiment of the present invention.

Referring now to the drawings wherein the showings are for the purpose of illustrating a preferred embodiment of the invention only and not for the purpose of limiting same, FIG. 1 illustrates a treatment cell 10 for applying surface treatment to a metal foil F. In accordance with the present invention, a process and apparatus are described for treating copper foil. While the following description will pertain to the treatment of copper foil, it should be appreciated that the present invention has wider application and may be used in treating metal foils or plates of metal other than copper.

Broadly stated, cell 10 is basically comprised of a drum 12 which is rotatable about a generally horizontal axis which is also the longitudinal axis of anode 14. Drum 12 and anode 14 define an annular gap 16 therebetween, which gap 16 according to the present invention contains an electrolytic solution including ions of the metal to be plated on foil F. Foil F travels along a predetermined path defined by guide rollers 18 and drum 12. In this respect, foil F travels across the surface of drum 12 through gap 16. Power means (not shown) are provided to create an electrical potential across the foil and anode 14 which causes the metal ions in the electrolytic solution to be deposited on the exposed surface of foil F.

Referring more specifically to cell 10, drum 12 is generally cylindrical in shape and rotatable about the generally horizontal axis on a shaft 20 by conventional means (not shown). FIG. 1 shows a sectional end view of drum 12. In the embodiment shown, drum 12 is generally comprised of an inner annular wall 22 and a layer 24 of non-conductive material on the outer surface thereof. Inner wall 22 may be formed from any rigid material, but is preferably formed from carbon steel. Layer 24 is preferably formed of a semi-hard rubber material (90-97 Durometer hardness) and has a smooth, cylindrical outer surface 26.

Referring now to anode 14, in the embodiment shown, anode 14 is comprised of a anode sections 14a, 14b. Sections 14a and 14b are generally mirror images of each other and, therefore, only one section shall be described in detail, it being understood that such description applies equally to the other section. Referring now to the left-hand side of FIG. 1, anode section 14a is generally comprised of a curved plate 28 secured to a plurality of longitudinally spaced-apart bulkheads 30. Plate 28 is formed into a generally cylindrical shape and has an upward facing cylindrical surface 32. Plate 28 is dimensioned to generally correspond to outer surface 26 of drum 12 and preferably to surround at least twenty-five percent (25%), i.e. one-quarter, of the circumferential profile of drum 12. In the embodiment shown, each anode section 14a, 14b, circumscribes an angle approximately 105° defined by the axis of shaft 20.

Bulkheads 30 generally provide structural support to plate 28. In the embodiment shown, bulkheads 30 are generally L-shaped members having a curved edge dimensioned to correspond to the curvature of plate 28 and to be secured thereto. Bulkheads 30 are spaced-apart and parallel to each other and extend along the length of plate 28.

Plate 28 and bulkheads 30 are preferably formed of an electrically-conductive metal or metal alloy. Plate 28 is also preferably formed of a metal which is inert, i.e. non-reactive to the electrolytic solution which is used in treating foil F, or a metal which may be coated so as to be inert to the electrolytic solution. In this respect, anode 14 may be formed from lead, stainless steel, columbium, tantalum, titanium, or an alloy thereof. In a preferred construction, anode 14 is comprised of titanium, and plate 28 in bulkheads 30 are welded together to form an integral, rigid structure.

Each anode section 14a, 14b includes a trough 33 along the upper edge thereof. Trough 33 is operable to collect electrolytic solution which overflows from gap 16. Trough 33 is basically comprised of a plurality of chambers 34 formed between adjacent bulkheads 30 by L-shaped wall member 36. L-shaped wall members 36 are connected to bulkheads 30 and plate 28 and form a fluid-tight connection therewith. In this respect, wall members 36 are preferably welded to plate 28 and bulkheads 30. Adjacent chambers 34 communicate with each other by openings 38 which are provided in bulkheads 30. One or more drain pipes 40 are secured to trough 33 and communicate with chambers 34 to convey electrolytic fluid collected in trough 33 to a reservoir (not shown) by conventional pipe means.

Referring now to FIGS. 2–5, anode section 14a includes a plurality of connector blocks 42 disposed between bulkheads 30. Connector blocks 42 are generally rectangular bars of electrically-conductive material dimensioned to extend between adjacent bulkheads 30 and abut against plate 28. Connector blocks 42 are provided between each bulkheads 30 and aligned to generally form spaced-apart rows of connector blocks 42, which rows extend along the length of plate 28 generally parallel to the axis of drum 12. Connector blocks 42 are operable to be connected to an electrical power source (not shown) and accordingly may be formed from any electrically-columbium, material or metal alloy, such as lead, stainless steel, columbium, tantalum, titanium or an alloy thereof. Preferably, connector blocks 42 are formed of the same material as that forming plate 28 and bulkheads 30. In the embodiment heretofore described, connector blocks 42 are formed of titanium.

Figure 2:
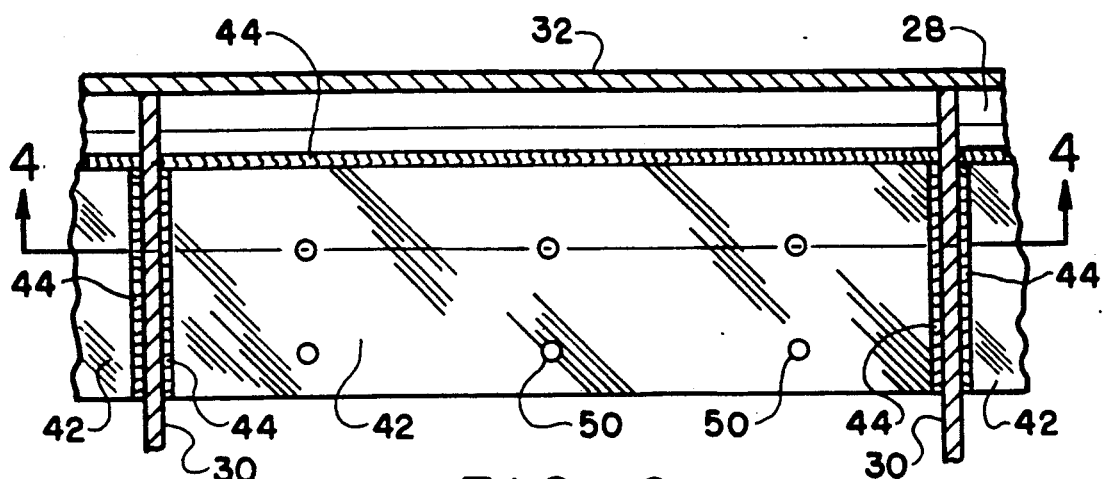
FIG. 2 is a sectional view taken along line 2—2 of FIG. 1.
Figure 3:
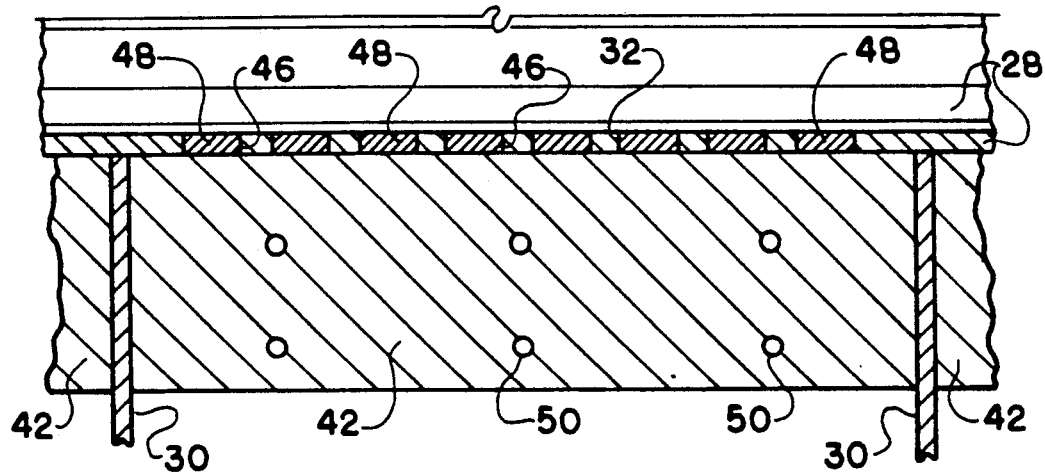
FIG. 3 is a sectional view taken along line 3—3 of FIG. 1.
Figure 4:
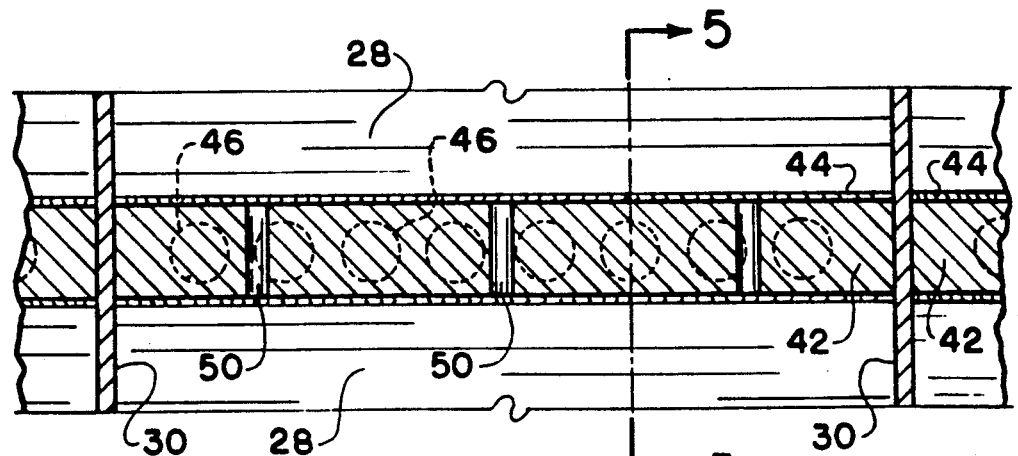
FIG. 4 is a sectional view taken along line 4—4 of FIG. 2.
Figure 5:
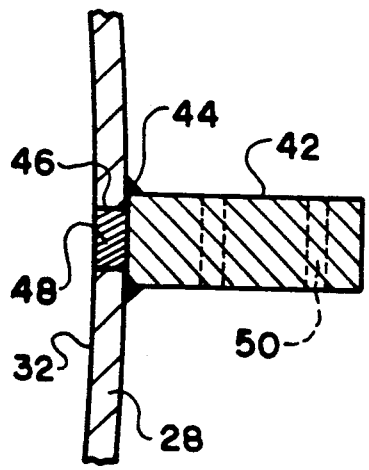
FIG. 5 is a sectional view taken along line 5—5 of FIG. 4.

In the embodiment shown, connector blocks are secured to plate 28 and bulkheads 30 by welding. Fillet welds 44 are formed between plate 28 and connector blocks 42 and between adjacent bulkheads 30 and block 42 as best seen in FIGS. 2 and 5. To ensure good electrical contact between block 42 and plate 28, block 42 is preferably plug welded to plate 28 as best seen in FIGS. 3–5. To this end, a plurality of aligned cylindrical holes 46 are formed through plate 28. Holes 46 are disposed to be in registry with connector blocks 42, and are filled with weld 48 to secure connector block 42 to plate 28 and, more importantly, to provide a current path from connector blocks 42 to plate 28. In the embodiment shown, eight plug welds are provided wherein weld material comprises approximately 47% of the surface contacting connector blocks 42. Connector blocks 42 include a plurality of cable mounting apertures 50. Apertures 50 are dimensioned to receive fasteners of conventionally-known electrical cables (not shown) to connect connector blocks 42 to one pole of the aforementioned power source. To facilitate the electrical conduction and to retard corrosion, the outer surface of connector blocks 42 may be plated with conductive material such as silver, platinum, or gold.

Figure 6:
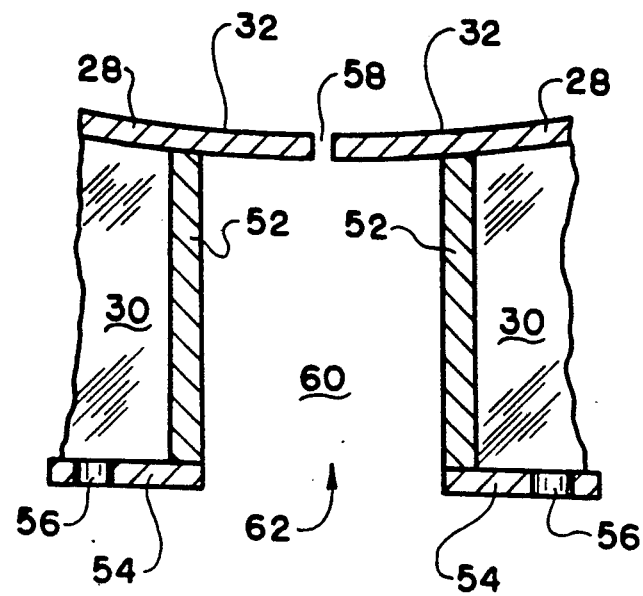
FIG. 6 is an enlarged view illustrating an electrolytic solution inlet port of the apparatus shown in FIG. 1; and, FIG. 7 is an enlarged sectional view illustrating a seal arrangement according to the present invention provided between the anode and the drum.

Referring now to FIG. 6 lower ends of anode sections 14a, 14b are shown. Each section 14a, 14b includes a generally vertical structural member 52 secured at its upper end to curved plate 28 at its lower end to a mounting pad 54. Each mounting pad 54 includes an aperture 56 dimensioned to receive a standard fastener. Vertical member 52 is recessed from the end of plate 28. Anode sections 14a, 14b are dimensioned to be secured to each other and to define a slot 58 between the ends of plate 28. Plates 28 and vertical support members 52 of anode sections 14a, 14b define an elongated generally rectangular chamber 60 open at its lower end, which chamber 60 extends generally parallel to the axis of drum 12. According to the present invention, the ends of chamber 60 are sealed wherein an elongated generally rectangular opening 62 is defined at the bottom of chamber 60 wherein mounting pads 54 extend about the periphery thereof. Mounting pads 54 are adapted to be attached to an electrolytic fluid supply conduit (not shown) through which electrolytic fluid is forced into chamber 60 and through slot 56 into annular gap 16.

Figure 7:
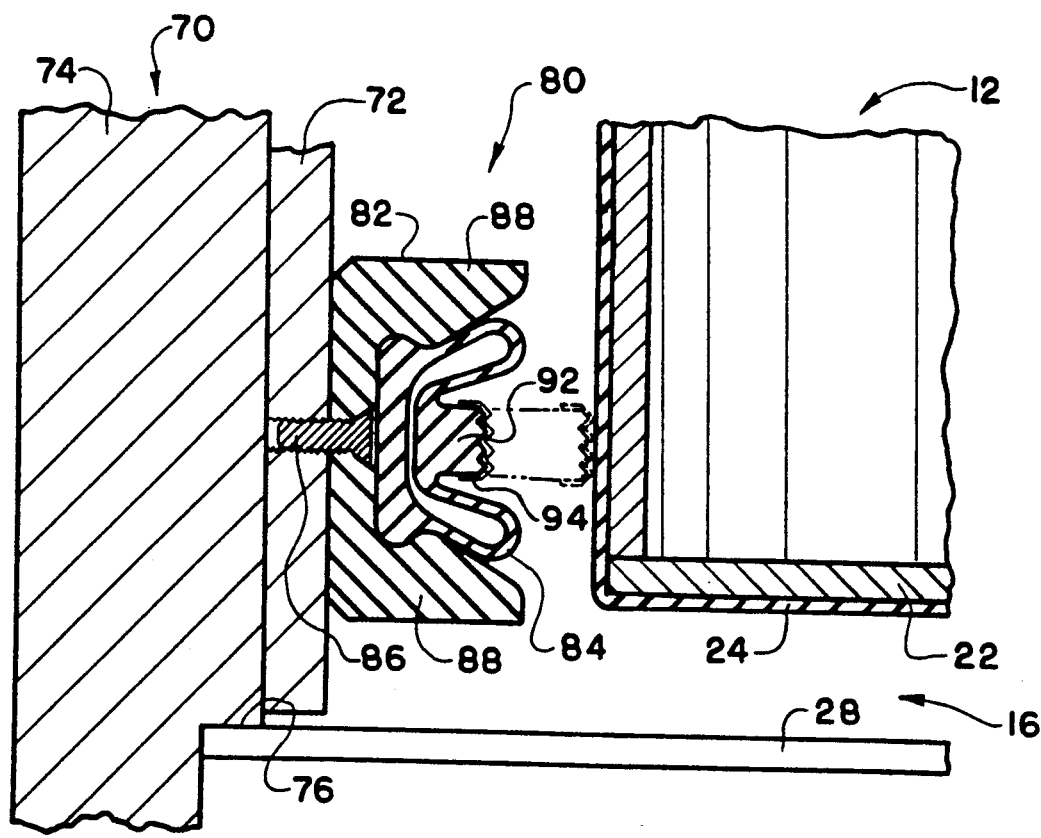

As shown in FIG. 1, anode sections 14a, 14b are dimensioned to be position around drum 12 and define annular gap 16 therebetween. A generally vertical end wall 70 (best seen in FIG. 7) is provided at each end of cell 10 to abut the ends of anode sections 14a, 14b. End walls 70 and anode sections 14a, 14b together define a generally semi-cylindrical tank in which drum 12 is disposed. According to the present invention, anode section 14a, 14b are preferably insulated electrically from each other. To this end, gaskets of an insulating material (not shown) are preferably provided between contacting surfaces of anode sections 14a, 14b, and end walls 70 are preferably formed from an electrically non-conductive material. In the embodiment shown, end wall 70 is comprised of an inner plate 72 and an outer plate 74 which are both preferably formed of chlorinated polyvinylchloride (CPVC) material. Outer plate 74 includes an annular shoulder 76 which is dimensioned to receive plate 28 of anode sections 14a, 14b, as shown in FIG. 7. Outer plate 74 is secured to anode sections 14a, 14b by conventional means (not shown).

An elongated seal assembly 80 is mounted to inner plate 72 to form a seal between end wall 70 and the distal ends of drum 12 to confine the electrolytic solution with gap 16, i.e. between the outer surface of drum 12 and plate 28. Seal assembly 80 is comprised of a holder 82 and an inflatable seal 84. Holder 82 is mounted to inner plate 72 by conventional fasteners 86 and extends along the edge of plate 72 adjacent plate 28 of anode section 14a, 14b. In cross-section, holder 82 is generally U-shaped and has side portions 88, having inner surfaces which project inwardly toward each other.

Seal 84 is an elongated, tubular element of resilient material, such as rubber, having a flared base portion 90 dimensioned to be retained within holder 82 between the projections on side portions 88. Seal 84 includes a serrated pad 92 generally facing drum 12. According to the present invention, a layer 94 of teflon is provided on pad 92. Seal 84 includes an air connection stem (not shown), preferably located at one end thereof, which is connectable to an air source. Seal 84 is operable to be inflated to a position shown in phantom in FIG. 7, wherein pad 92 abuts and seals against drum 12. In this respect, layer 94 reduces the friction between rubber pad 92 and rubber coating 24 on drum 12. Thus, according to the present invention, anode 14 is electrically isolated from drum 12 and surrounding support surfaces. In this respect, non-conductive gaskets may be provided anode 14 and any mounting or connecting surfaces connected thereto.

Referring now to the operation of cell 10, foil F to be treated is conveyed over guide rollers 18 and drum 12 through gap 16. Drum 12 is rotated to cause foil F to move continuously through gap 16. In the embodiment shown, drum 12 is rotated in a counterclockwise direction and rollers 18 rotate in a clockwise direction to move foil F left to right in FIG. 1. In this respect, foil F enters one end of gap 16 (leading end) and exits the other end of gap 16 (the trailing end). As will be appreciated, the direction of rotation of drum 12 and rollers 18 does not affect the operation of cell 10. Electrolytic solution is continuously pumped at a controlled rate into chamber 60 and through slot 58 into gap 16. The electrolytic solution may be pumped from a reservoir (not shown) by conventionally-known means. Solution from gap 16 overflows the upper edge of anode 14 and is collected in troughs 33 to be returned to the reservoir.

According to the present invention, power means are provided to create an electrical potential across foil F and anode 14. According to the present invention, the negative pole of the power source is preferably connected to guide rollers 18, as schematically illustrated in FIG. 1. In the embodiment shown, guide rollers 18 are preferably formed on an electrically conductive metal so as to create a positive charge through foil F. Anode 14 is connected to the positive pole of the power supply by means of conventionally-known electrical cables attached to connector blocks 42. An electrical potential is thereby created between anode 14 and foil F within gap 16. As the positively charged foil F passes through the electrolytic solution within gap 16, ions within the electrolytic solution are deposited onto foil F. In this respect, non-conductive layer 26 insulates foil F from inner metal wall 22 of drum 12 and at the same time provides a seal against the upper (non-exposed) surface of foil F to prevent this surface form being plated while foil F is exposed to the electrolytic solution in gap 16.

Importantly, according to the present invention, the parameters affecting treatment of foil can be better monitored due to the unique characteristics of the disclosed apparatus. In this respect, one advantage of the present invention is that the treatment zone is more clearly defined and, therefore, control of parameters which affect treatment within the zone can be more closely controlled and monitored. Specifically, the present invention provides a uniform, annular gap between outer surface 26 of drum 12 and the upper surface 32 of anode 14. By sealing the axial ends of gap 16, a clearly defined treatment zone of known dimension is established between the leading and trailing ends of gap 16. In this respect, anode 14, in addition to being an electrically charged surface, is essentially a tank which contains the electrolytic solution. Moreover, by electrically charging the entire anode surface, the treatment zone defined between anode 14 and drum 12 is clearly defined, as is the electrical potential across foil F and anode 14. Because electrolytic solution is in contact only with surface 32 of anode 14, the electrical potential in gap 16 is created only between surface 32 of anode 14 and foil F. With this clearly identifiable treatment zone, control over the electrical potential created across foil F and anode 14 can be more accurately controlled. This, together with the fact that annular gap 16 is of a known volume, permits greater control over the flow of electrolytic solution in the gap as well as the concentration of ions contained therein. Each of these factors together provides more precise flow control and, therefore, improved treatment efficiency.

As indicated above, the present invention provides a precise interelectrode gap. In this respect, plate 28 provides a long-lasting anode surface of precise shape and utilizes the inert properties of titanium to provide longer cell life. Also important, the present invention lends itself to the creation of a treatment zone of greater length in that anode 14 is dimensioned to surround the greater portion of drum 12. In this respect, in the embodiment shown, anode 14 surrounds approximately 58% of the external surface of drum 12. By providing a longer treatment zone, a lower current density may be created within such zone to affect a desired treatment of foil F. In other words, by forming anode sections which are joined together, a greater percentage of the surface area of drum 12 cane surrounded wherein a longer treatment zone is formed. With a longer treatment zone, line speed may be increased in that the larger zone exposes the charged foil to the electrolytic solution for the same period of time as would an apparatus having a shorter treatment zone operated at a slower speed.

The present invention has been described with respect to a preferred embodiment. Modifications and alterations will occur to others upon the reading and understanding of the specification. It is intended that all such modifications and alterations be included insofar as they come within the scope of the patent as claimed or the equivalents thereof.

Having described the invention, the following is claimed:

1. An apparatus for applying a surface treatment to a metal foil comprising:
   a drum rotatable about a generally horizontal axis for guiding a continuous metal foil about a predetermined path, said drum having a non-conductive outer surface;
   tank means adapted to contain an electrolyte solutions said tank means comprised of a plate formed from a metal selected from the group consisting of stainless steel, titanium, tantalum, columbium, and alloys thereof and having a radius of curvature generally conforming to the radius of curvature of said drum, said plate having an upper surface facing said drum and a lower surface facing away from said drum, said plate being dimensioned to surround a lower portion of said drum and to define an annular gap between said upper surface and said drum, a portion of said predetermined path of said metal foil extending through said gap;
   means for creating a liquid-tight seal at the end of said gap between said plate and said drum;
   means for creating a continuous flow of electrolyte through said gap; and
   a plurality of spaced-apart connector bars secured by welding to said lower of said plate, each of said connectors being formed of the metal forming said plate and being secured to said plate by multiple weld areas wherein said weld areas between said plate and said connector are dimensioned to provide the primary current paths between said plate and said connectors;

power means connected to said metal foil and said connector to create an electrical potential across said foil and said upper surface of said tank means.

2. An apparatus as defined in claim 1 wherein said tank means surrounds at least one-half (½) the surface area of said drum.

3. An apparatus as defined in claim 1 wherein said means for creating a continuous flow is comprised of inlet port means disposed at the lowest most portion of said tank means and collector means disposed along the highest most portion of said anode means, said collector means being operable to collect electrolyte overflowing from said gap.

4. An apparatus as defined in claim 1 wherein said power means is connected to said foil as cathode and to said tank means as anode.

5. An apparatus as defined in claim 1 wherein said tank means is comprised of side-by-side tank sections, which are dimensioned to be assembled together around said drum, each of said sections including a curved plate defining a portion of said upper surface.

6. An apparatus as defined in claim 5 wherein said tank sections are spaced apart when assembled to define an elongated slot therebetween, said slot defining an inlet port for introducing electrolyte into said gap.

7. An apparatus as defined in claim 6 wherein each of said tank sections includes collator means at the upper end thereof to collect electrolyte flow of out of said gap.

8. An tank for use in an electrodeposition cell for treating a surface of metal foil, said cell including a rotatable drum having a non-conductive outer surface over which said metal foil passes, comprised of:

curved plate means to be positioned below said drum, said plate means having a lower surface facing away from said drum and a smooth cylindrical upper surface dimensioned to be positioned circumjacent said drum wherein an annular gap is defined between said drum and said cylindrical upper surface, said plate means being formed from an electrically conductive metal selected from the group consisting of stainless steel titanium, tantalum, columbium, and alloys thereof, and has an upper surface which is inert to said electrolytic solution and has a leading end and a trailing end in the direction of movement of said metal foil;

means for creating a liquid-tight seal at the end of said gap between said cylindrical upper surface of said plate means and said drum;

aperture means formed in said plate means between said leading end and said trailing end operable to connect said gap with a source of electrolytic fluid, wherein said fluid may be forced into said gap;

collector means mounted to said plate means at said leading end and said trailing ends thereof operable to collect electrolytic solution flowing from said cavity; and, a plurality of connectors spaced apart on said lower surface of said plate means, each of said connectors being formed of the metal forming said plate means and being secured to said plate means by multiple weld areas, wherein said weld areas between said plate means and said connectors are dimensioned to provide the primary current paths between said plate means and said connectors, an electrical power source connectable to said connectors and said foil, wherein said connectors electrically charges said plate means and creates an electrical potential across said foil and said upper surface of said plate means.

9. An tank as defined in claim 8 wherein said connector means is comprised of a plurality of metal blocks.

10. An tank as defined in claim 9 wherein said plate means and said blocks are titanium.

11. An tank as defined in claim 8 wherein said anode surrounds at least fifty percent (50%) of the surface area of said drum.

12. An tank as defined in claim 8 wherein said anode is comprised of first and second tank sections, each of said sections dimensioned to surround more than twenty-five percent (25%) of the surface area of said drums.

13. An tank as defined in claim 12 wherein said aperture means is an elongated slot defined between said anode sections.

14. An tank as defined in claim 8 wherein said curved plate means is formed of a metal which is inert to said electrolytic solution.

15. An tank as defined in claim 14 wherein said plate means is formed from titanium or an alloy thereof.

16. An tank as defined in claim 8 wherein said curved plate means is formed of an electrically conductive metal having a coating thereon, which coating is inert to said electrolytic solution.

* * * * *